United States Patent [19]
Adams et al.

[11] Patent Number: 5,793,592
[45] Date of Patent: Aug. 11, 1998

[54] DYNAMIC DIELECTRIC PROTECTION CIRCUIT FOR A RECEIVER

[75] Inventors: Robert D. Adams, Essex Junction; George M. Braceras, Colchester; John Connor, Burlington; Donald A. Evans, Willston, all of Vt.

[73] Assignee: International Business Machines Corporation, Armonk, N.Y.

[21] Appl. No.: 855,187

[22] Filed: May 13, 1997

[51] Int. Cl.[6] ................................................ H02H 3/20
[52] U.S. Cl. ........................................... 361/90; 361/111
[58] Field of Search ............................. 361/90, 91, 92, 361/111, 58, 56; 307/130

[56] References Cited

U.S. PATENT DOCUMENTS

| | | |
|---|---|---|
| 3,708,694 | 1/1973 | Evans . |
| 3,819,952 | 6/1974 | Enomoto et al. . |
| 4,930,037 | 5/1990 | Woo . |
| 5,218,506 | 6/1993 | Harris .......................................... 361/90 |
| 5,333,093 | 7/1994 | Krautschneider et al. . |
| 5,565,790 | 10/1996 | Lee . |

*Primary Examiner*—Jeffrey A. Gaffin
*Assistant Examiner*—Michael J. Sherry
*Attorney, Agent, or Firm*—Whitham, Curtis & Whitham; Eugene I. Shkurko

[57] ABSTRACT

A topology for arranging a plurality of transistors between a signal source and an off-chip receiver, using a single power supply voltage. A pass through NFET has a gate controlled by a network comprised of two transistors arrayed between the power supply voltage and the drain of the NFET, which limits overshoots to the power supply voltage and reduces undershoots. Further reduction of undershoots is accomplished by an additional network of transistors, optimally including a PFET in series with the pass through NFET.

15 Claims, 12 Drawing Sheets

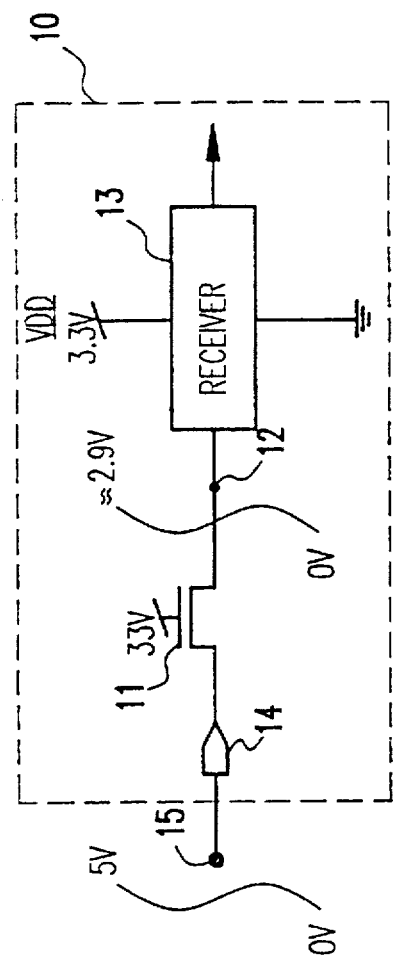
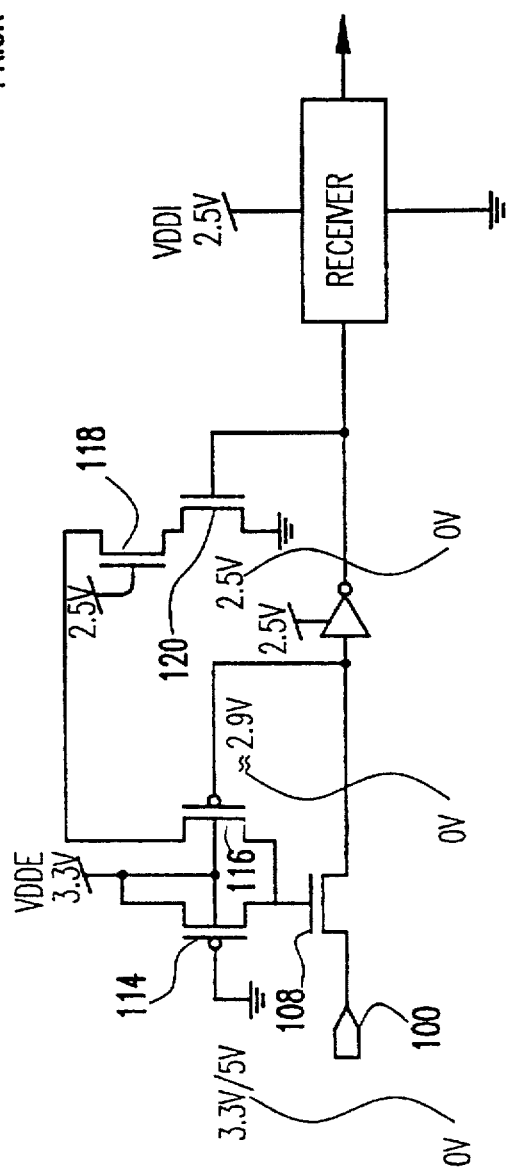
FIG.1
PRIOR ART
FIG.1A
PRIOR ART

DYNAMIC DIELECTRIC PROTECTION CIRCUIT FOR A RECEIVER

BACKGROUND OF THE INVENTION

1. Field of the Invention

The present invention generally relates to over-voltage protection mechanisms for low voltage integrated circuits, and in particular to such mechanisms where the receiving circuit is fabricated in a lower voltage technology than the driving circuit.

2. Background Description

Receivers can receive input signals which come from elsewhere in the system than the chip on which the receiver resides. These signals can have higher voltages than that tolerable by the technology of the receiver. There are two reasons that the voltage can be too high on these inputs. The first is that the chip which is driving the signal has a higher supply voltage and comes from an older technology than the chip which is receiving it. This is often the case for memory chips. The memory chip is from the latest technology, whereas the logic chip is from the previous generation. The second reason for an over-voltage is ringing on the network. This ringing is transitory, but nonetheless must be protected against. The thin oxides in advanced low voltage CMOS technologies can suffer dielectric breakdown from the cumulative effects of repeated overvoltage events if not protected.

In the prior art a number of circuit topologies have been used to handle these over-voltages. For example, as shown in FIG. 1, a single N-channel field effect transistor (NFET) 11 has been employed between the input pad 14 and receiver 13 on receiving chip 10. This enables receiving chip 10 to handle a signal from off-chip source 15 using a higher supply voltage (5v) and prevents the voltage on node 12 from rising higher than the supply voltage VDD (3.3v) of the receiver 13 minus the threshold voltage ($Vt_{nfet}$) of NFET 11.

Advancements in CMOS technology have resulted in lower operating voltages (e.g. 2.5 volts), thinner gate oxides, and enhanced performance. To avoid leakage current through a partially "ON" device in the receiver and to achieve greater performance, it is desirable to pass the full VDD level to the receiver input instead of the reduced VDD–$Vt_{nfet}$ level of the prior art shown in FIG. 1. FIG. 1A shows a prior art circuit in which this is accomplished. FIG. 2 shows a variant on this prior art, where a voltage level slightly higher than the receiver's operating voltage is passed through to the receiver via NFET 108.

However, this second prior art approach requires multiple power rails within the chip on which the low voltage receiver resides. As shown in FIG. 2, VDDI (2.5v) is the operating voltage of the technology on the chip. VDDE (3.3v) is a higher voltage which can be applied to the gate of NFET 108 when a HIGH is present at input pad 100. The implementations shown in FIGS. 1A and 2 also burn dc current when a LOW is present at input pad 100 since the voltage divider network of transistors 114, 116, 118 and 120 is enabled.

In U.S. Pat. No. 5,333,093 to Krautschneider et al. there is shown a protection circuit for series pass MOSFETs using a single +3.3V voltage. This protection circuit has two problems, both of which can be seen with reference to FIG. 1 in the '093 patent. First, the gate electrode of the pass through device M1 can reach Vin–$Vt_{nfetM2}$ (5.5v–0.5v). With the gate of M1 so biased, the potential on node Vb is Vin–($Vt_{nfetM2}$+$Vt_{nfetM1}$). If Vin happens to overshoot 1v above the 5.5V dc maximum, the gate of M1 can reach 6.0v and node Vb can reach ~5.0v (6.0v–(0.5v+0.5v)). This results in a 5.0v gate to source stress across device M4. The second problem is that M2 "cuts-off" when the input is brought low. Since Vin is brought to a lower potential than the gate of M1, the source of M2 is now node Vin and M2 cuts off because its Vgs equals zero. With M2 cut off, a trapped potential of 6.0v on the gate of M1 can occur. If the input is brought back down to ground, a gate to source stress of 6.0v would occur across the oxide of M1. If a –1v undershoot occurred on Vin, the M1 oxide stress would be 7.0v. Therefore, the structure does not protect the gate oxide of device M1 as claimed. Also, with M1 fully "ON", the –1v undershoot is passed to node Vb. This results in a gate to source stress of 4.3v across the gate of M3.

SUMMARY OF THE INVENTION

More recent advancements in CMOS technology have lead to even lower operating voltages (1.8v), thinner gate oxides, greater performance, and the zero Vt NFET. The thin oxides in advanced low voltage CMOS technologies need protection from over voltage conditions which can occur on chip I/O pads. Otherwise, dielectric breakdown could result from the cumulative effects of repeated over voltage events. The zero Vt NFET can pass a signal equal in magnitude to the gate voltage on the zero Vt NFET without the traditional Vt drop due to its near zero volt threshold voltage and small body effect component. Thus, with 1.8v on the gate of the zero Vt NFET and with a HIGH (1.8v or greater) present on the input pad, the zero Vt NFET can pass a voltage of ~1.8v to a receiver circuit.

It is therefore an object of the present invention to provide receiver over-voltage protection which only utilizes the operating voltage supply of the low voltage technology in which the receiver is fabricated, without bringing onto the receiver chip a higher voltage supply to bias the NFET pass gate.

It is also an object of the invention to provide over-voltage protection which passes a HIGH approximately equal in magnitude to the operating voltage of the receiver.

It is a further object of the invention to provide over-voltage protection which does not burn dc current at either input logic state.

It is a further object of the invention to provide protection to the elements of the protective circuitry as well as to the receiver.

It is still another object of the invention to protect the gate oxide of the device passing the signal in series to the receiver.

The invention provides a topology for arranging a plurality of transistors between a signal source and an receiver, using a single power supply voltage. This topology is designed to protect against input voltage signals which are higher than the supply voltage of the receiver (overshoots) and also to protect against input voltage signals which are lower than the ground rail of the receiver (undershoots). A pass through NFET has a gate controlled by a network comprised of two transistors arrayed between the power supply voltage and the receiver side of the NFET, which dynamically modulates (lowers) the gate voltage of the pass through NFET when an undershoot occurs at the input pad. Further reduction in the magnitude of undershoots passed through the NFET is accomplished by an additional network of transistors, optimally including a PFET in series with the pass through NFET.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a schematic of the prior art use of a single NFET between the input and the receiving circuit.

FIG. 1A is a schematic of the prior art use of multiple power supply levels to avoid threshold voltage drop.

DETAILED DESCRIPTION OF A PREFERRED EMBODIMENT OF THE INVENTION

Figure 2:
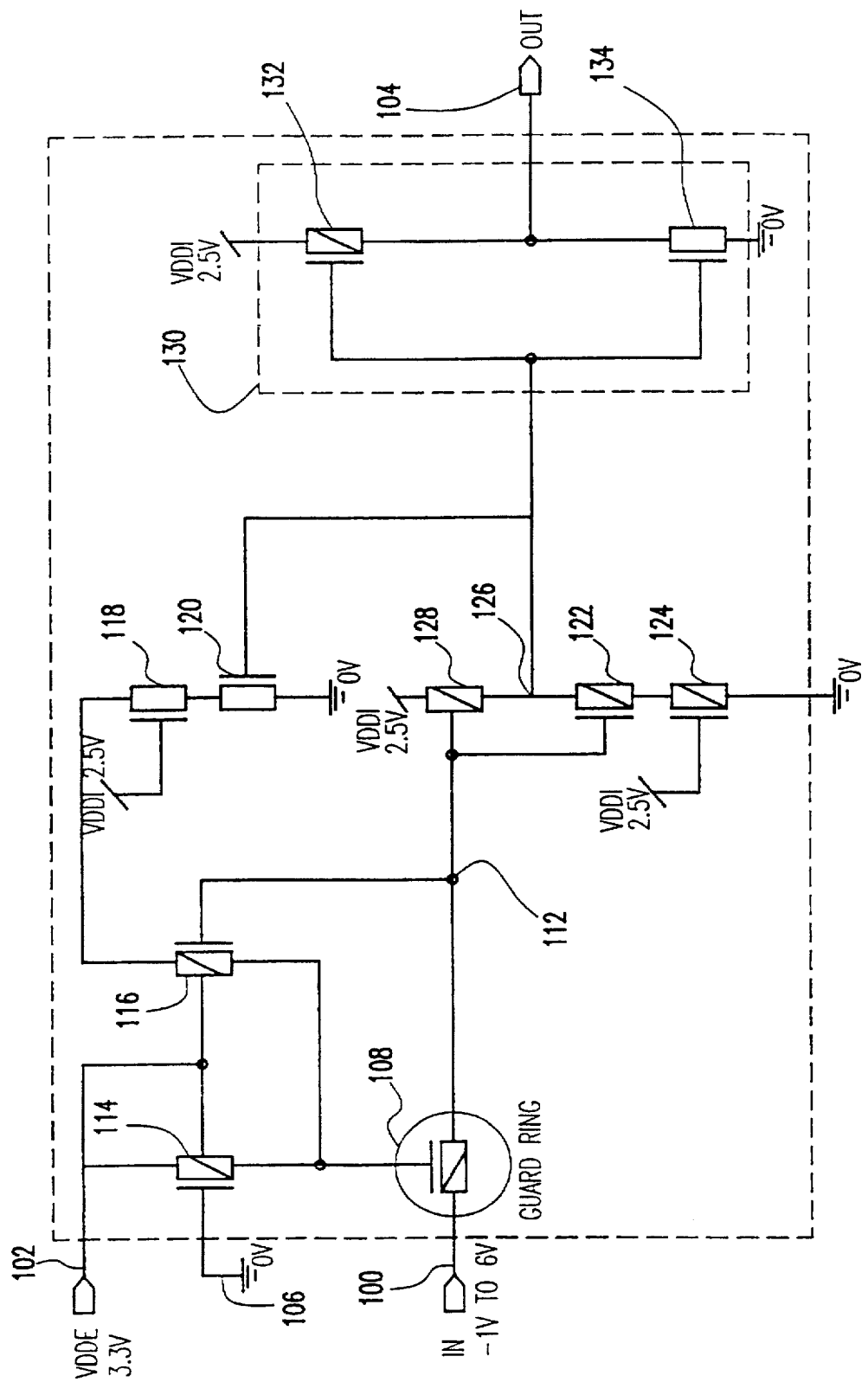
FIG. 2 is a schematic of the prior art use of multiple power supply levels to provide a voltage slightly higher than the receiver's supply voltage.
Figure 3:
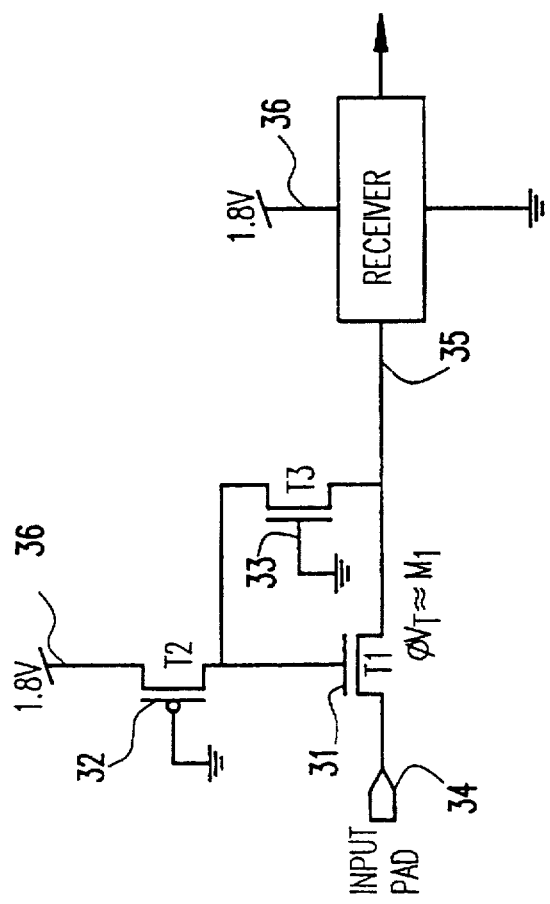
FIG. 3 is a simplified schematic of the present invention.

Referring now to the drawings, and more particularly to FIG. 3, there is shown a pass gate T1 having a near zero threshold voltage. When positive signals appear at input 34, T3 will be off and T2 will pass the supply voltage 36 to the gate 31 of T1. Consequently, if there is an overshoot above the supply voltage at input 34 T1 will not pass the overshoot through to node 35. If an undershoot occurs, the network formed by T2 and T3 will turn on, limiting the undershoot on node 35. This turn on characteristic also lowers the gate potential 31 of T1, because T2 and T3 then serve as a voltage divider between the supply voltage 36 and the undershoot at node 35. The lowered gate potential 31 of T1 prevents excessive oxide stress when the input undershoots, including undershoots during ringing.

T1 is a zero Vt NFET and T3 is a regular NFET (Vt=350 mv). As the input voltage goes below ground, node 35 follows the inputs low. This results in the gate 33 to source 35 voltage (Vgs) of NFET T3 to go positive. Also, as the source 35 of NFET T3 is brought below ground, the P substrate/N+ source junction becomes more forward biased thus reducing the Vt of NFET T3. This results in T3 becoming conductive, and the more negative the undershoot on node 35, the more conductive T3 becomes. T2 is always ON, with gate 32 grounded. T3 only conducts when the input 34 goes negative. At that point, T2 and T3 act as a voltage divider network.

Figure 3A:
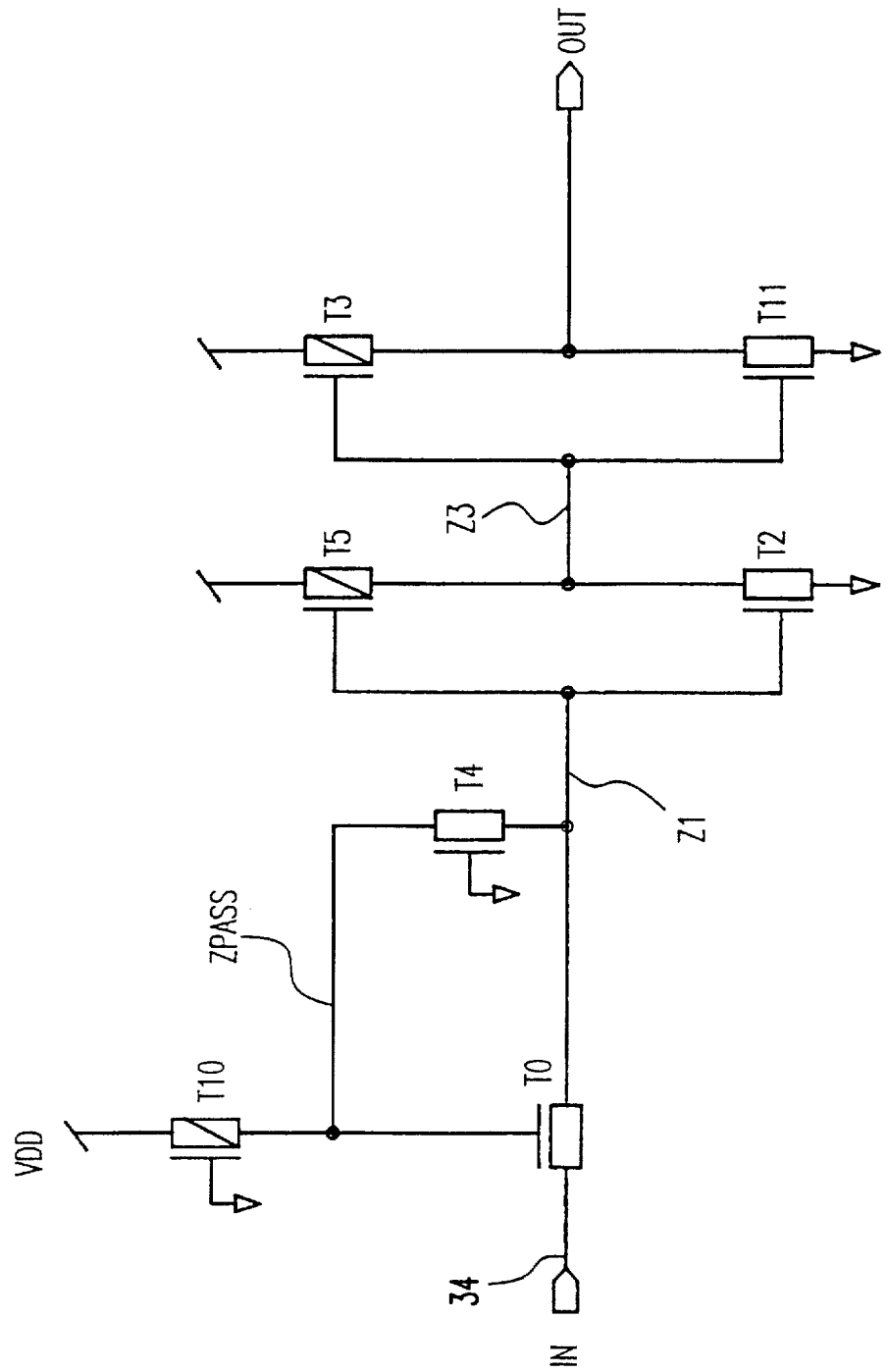
FIG. 3A is a circuit diagram of a practical circuit implementing the invention.

In common implementations, involving a single chip power supply, electro static discharge (ESD) diodes provide alternating current (AC) clamping of overshoots which are more than one volt above the power supply voltage and undershoots which are more than one volt below ground. FIG. 3A is a preferred embodiment of the invention, showing a device topology which can be employed if the magnitude of the potential voltage undershoots and overshoots are within the limits provided by such ESD diode clamping. Transistors T5 and T2 between nodes Z1 and Z3 represent a typical topology at the input of low voltage receivers. Transistors T0, T10 and T4 correspond to transistors T1, T2 and T3 of FIG. 3. With its gate tied to ground, PFET T10 is always on and passes supply voltage VDD (1.8v) to the gate of zero Vt NFET T0 when the input pad is more positive than ≈−0.3v. With an oxide stress limit of 2.5v, T0 can tolerate an input high of ≈−4.3v (1.8v +2.5v). This receiver could therefore interface on a standard 3.3v low voltage transistor to transistor logic (LVTTL) bus if overshoots are limited to 1v. Device T0 limits the magnitude of a high passed to node Z1 to 1.8v, thus protecting the gates of devices T2, T4 and T5. In the case of an undershoot at input 34 with a magnitude more than −0.7v (1.8v−2.5v), the gate voltage of T0 must be lowered to avoid over stressing T0's oxide. This is accomplished by devices T10 and T4. As the input 34 goes low, node Z1 follows. When the input reaches ≈−0.3v, NFET T4 turns on resulting in current flowing from VDD through devices T10, T4 and T0 to input pad 34. This action dynamically lowers the gate potential of TO due to voltage division at nodes ZPASS and Z1. The voltage on node Z1 must also be kept more positive than −0.7v to avoid a stress greater than 2.5v across PFET T5. This is accomplished by making T0 long (high impedance) and T4 wide (low impedance) which ensures an adequately large voltage drop across T0. The sizing of T10 is also important. Its impedance must be low enough to hold node ZPASS below 2.5v in response to a fast rising input. The effects of a fast rising input are shown by the ZPASS voltage dotted line in FIG. 3B. When Vin rises rapidly, the voltage at node ZPASS is coupled upward for a short time above the voltage at node Z3. Node ZPASS coupling up higher than 2.5v would stress the gates of devices T10 and T4. T10 must also be of high enough impedance such that the voltage division which occurs when NFET T4 turns on in response to an undershoot is able to pull down node ZPASS to an acceptable level.

Another source which limits the undershoot passed through to Z1 are the N+ source/drain diffusions of T0 and the N+ source diffusion of T4 which forward bias and conduct current from the grounded substrate of the chip when input 34 and node Z1 undershoot below −0.6v. These diffusions act like junction diodes, and their current is dependent on their cross sectional areas.

Figure 3B:
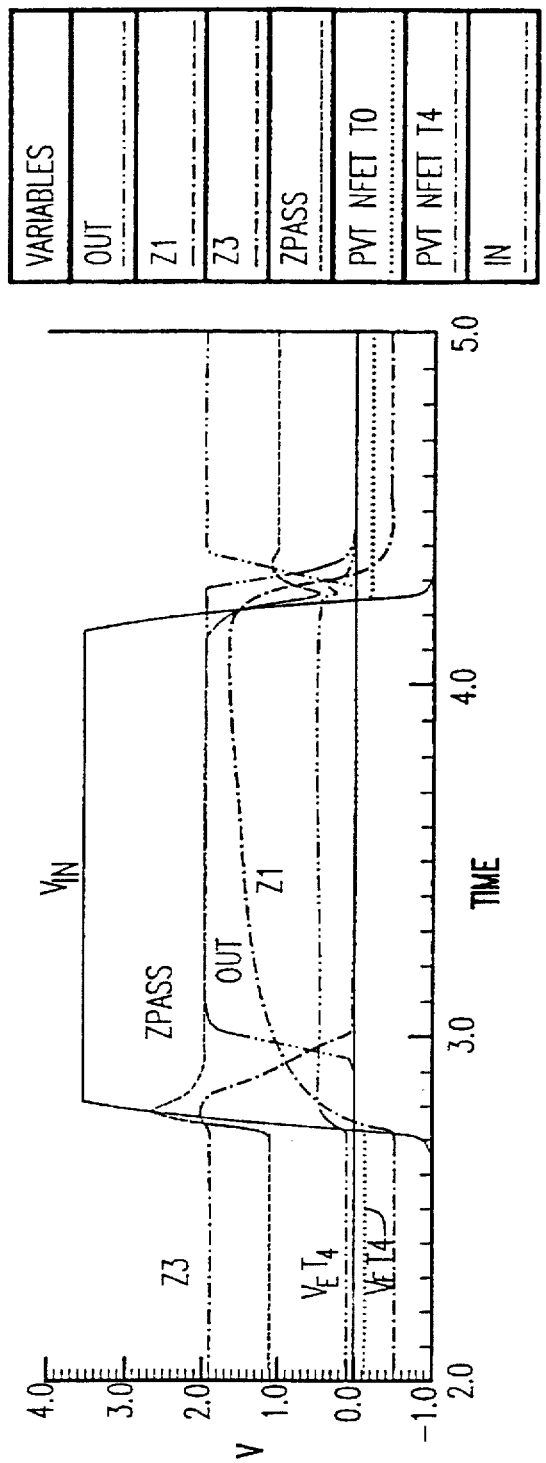
FIGS. 3B and 3C are voltage and current waveforms, respectively, showing worst-case operation of the circuit shown in FIG. 3A.
Figure 3C:
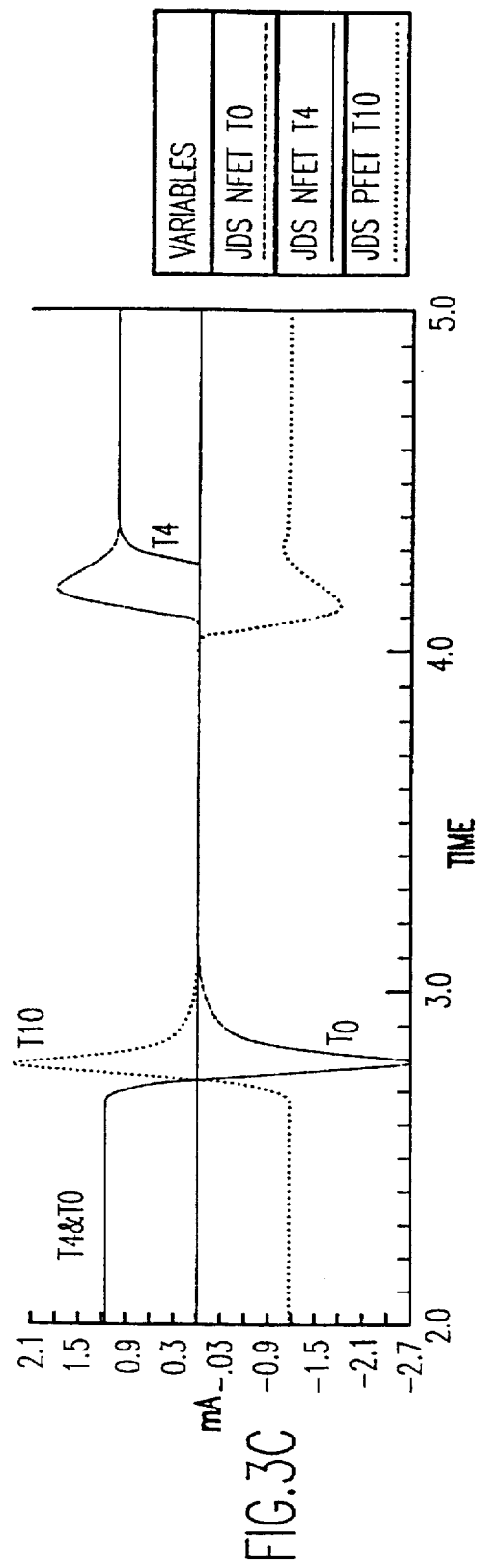

FIGS. 3B and 3C show unrealistic worst case voltage and current waveforms for the circuit of FIG. 3A. A dc voltage of −1v at input 34 is unrealistic since undershoots are transitory, not steady state. There is shown rise and fall times on input 34 of 100 ps, which are unrealistically fast. With a −1v input, voltage division across T10 and T4 results in ≈1.2v at ZPASS and ≈−0.5v at Z1. When the input 34 switches high to 3.5v, the current path through T4 is shut off and node ZPASS is capacitively coupled up above VDD and then pulled back down to VDD by T10. When the input 34 switches back to −1v, ZPASS is capacitively coupled down and T4 turns on at ≈−0.3v.

Figure 4:
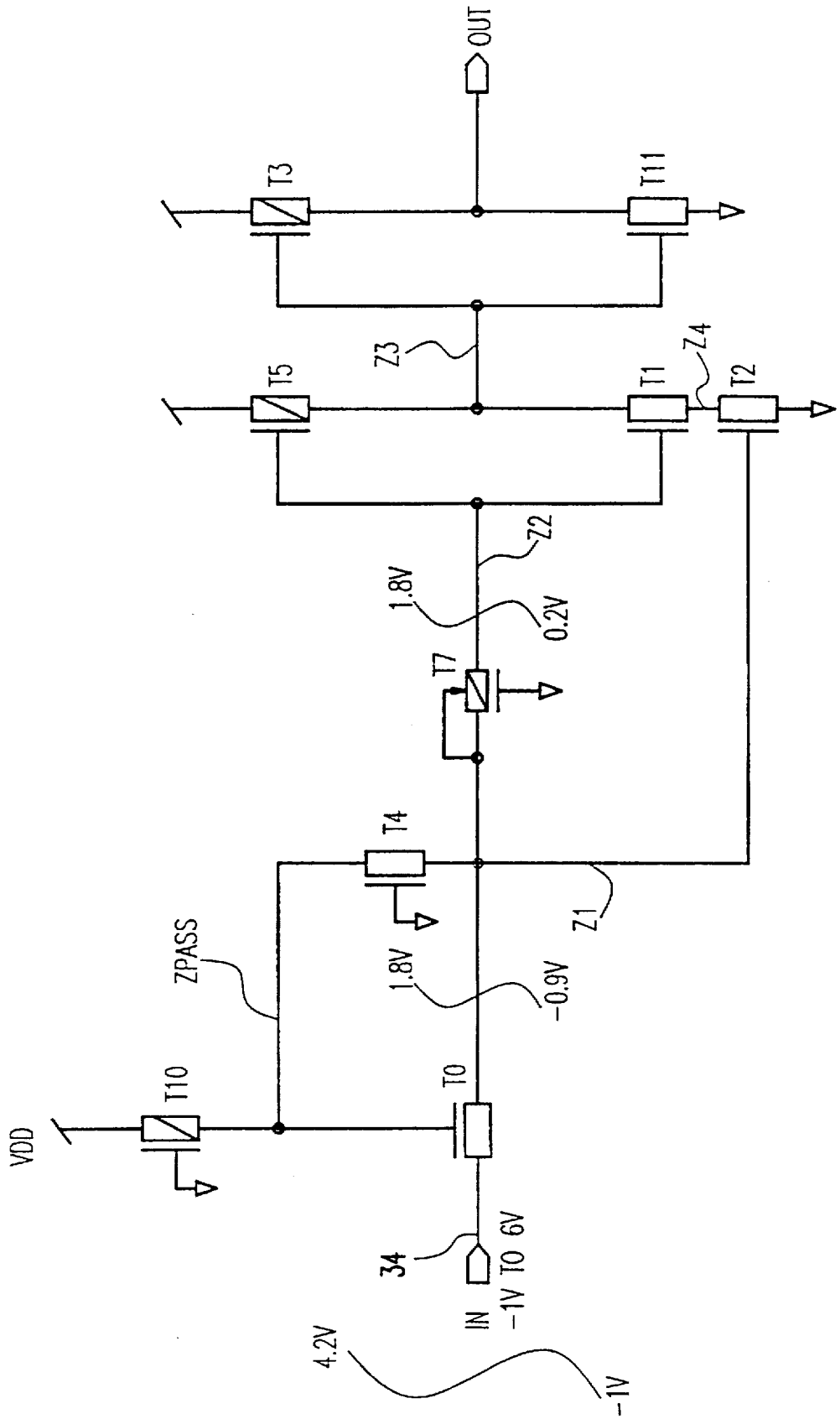
FIG. 4 is a circuit diagram of a preferred embodiment of the invention for a low voltage CMOS on-chip receiver using a series PFET.

Turning now to FIG. 4 there is shown another preferred embodiment of the invention. In the implementation of FIG. 3A, node Z1 is prevented from going too negative by making T0 long and T4 wide, which adds RC delay to the receiver circuit. However, in the implementation of FIG. 4 T0 can be made short (i.e. having a lower impedance) and T4 narrow (i.e. having relatively higher impedance). In FIG. 4, a PFET T7 is added in series between the zero Vt NFET T0 and node Z2. The gate of T7 is tied to ground and its NWELL is tied to node Z1. T7 protects the gate oxides of devices T5 and T1 from undershoots. An NFET can pass a good low voltage but reduces the magnitude of a high voltage by ($V_{gate}-(Vt+V_{body\ effect})$). The opposite is true of a PFET. It passes a good high voltage but reduces the magnitude of a low voltage by ($V_{gate}+(Vt_{pfet}+V_{body\ effect})$). When an undershoot occurs at the input pad 34, the transistor network of T10, T4 and T0 feeds current into the undershoot. The magnitude of the undershoot and the resistance of devices T10, T4 and T0 determines the subsequent voltage levels at nodes ZPASS and Z1. However, if the voltage at Z1 goes very negative, there is potential to overstress the gate oxide of devices T5 and T1. By placing PFET T7 between nodes Z1 and Z2, the voltage at Z2 is prevented from going below ($Vt_{pfet}+V_{body\ effect}$) when the input goes to ground.

Figure 4A:
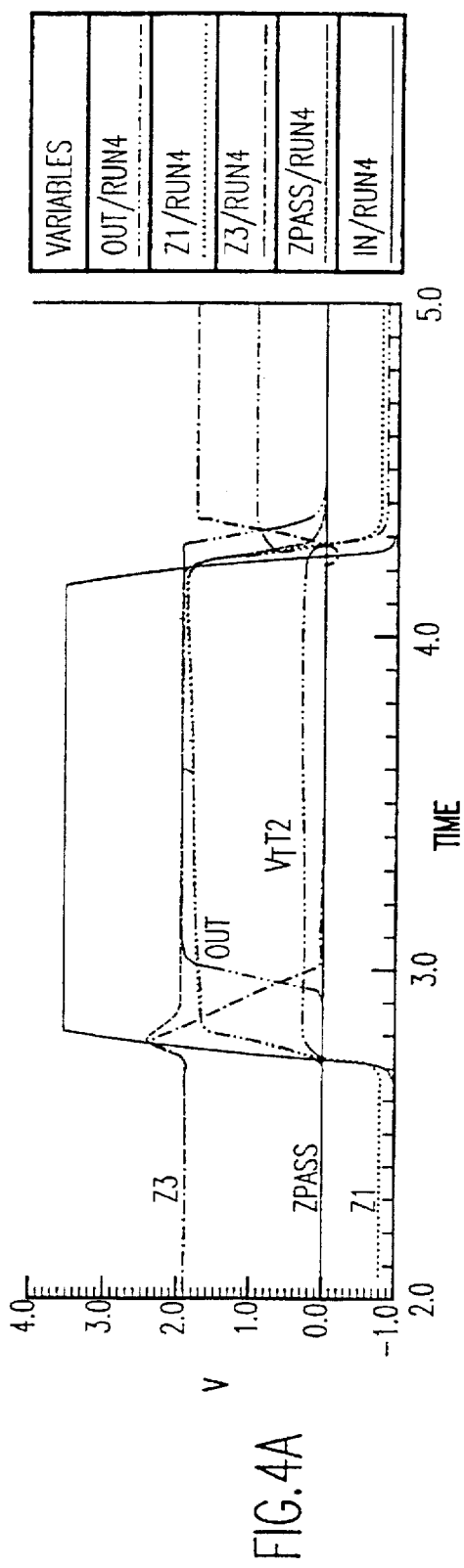
FIGS. 4A and 4B are voltage and current waveforms, respectively, showing worst-case operation of the circuit shown in FIG. 4.
Figure 4B:
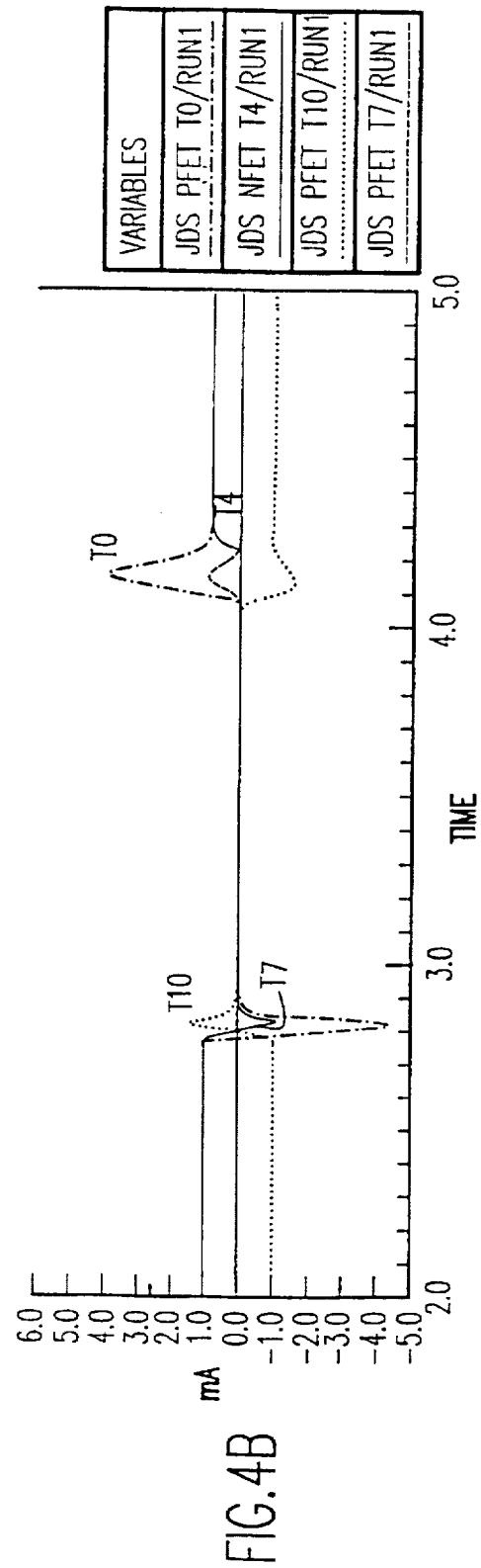
Figure 4C:
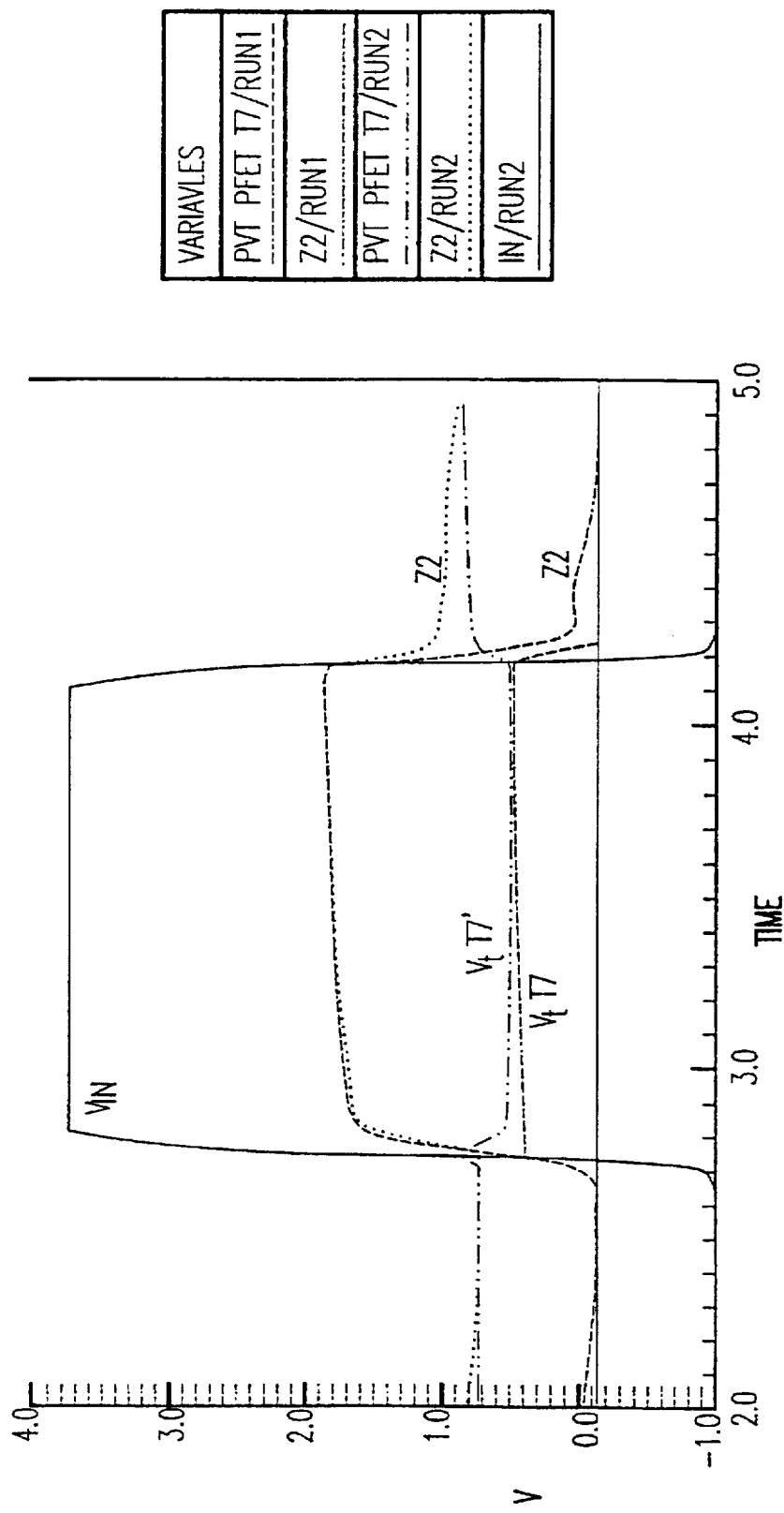
FIG. 4C is a voltage waveform diagram comparing certain variations in the FIG. 4 circuit.
Figure 4D:
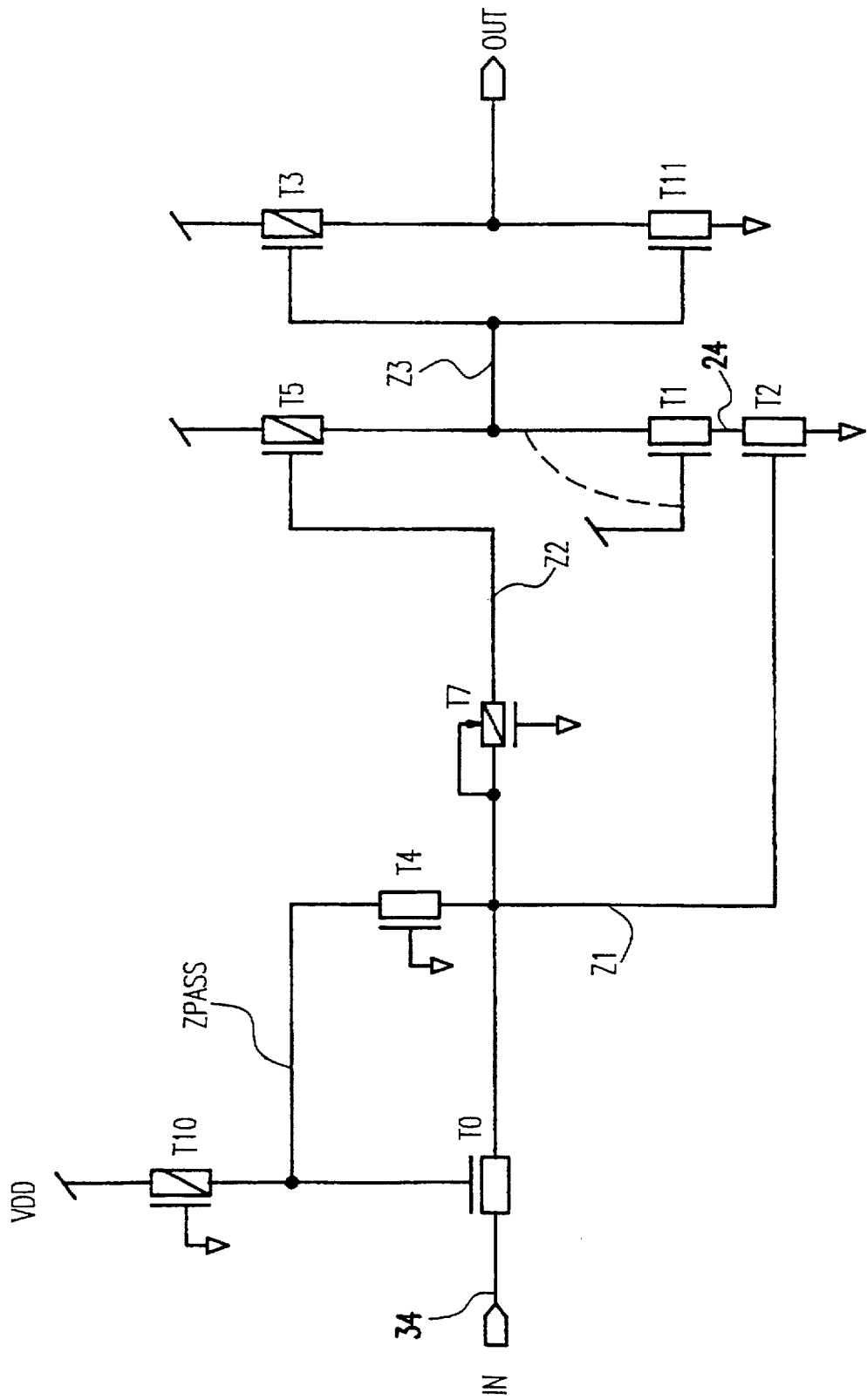
FIGS. 4D and 4E are additional preferred embodiments of the invention.
Figure 4E:
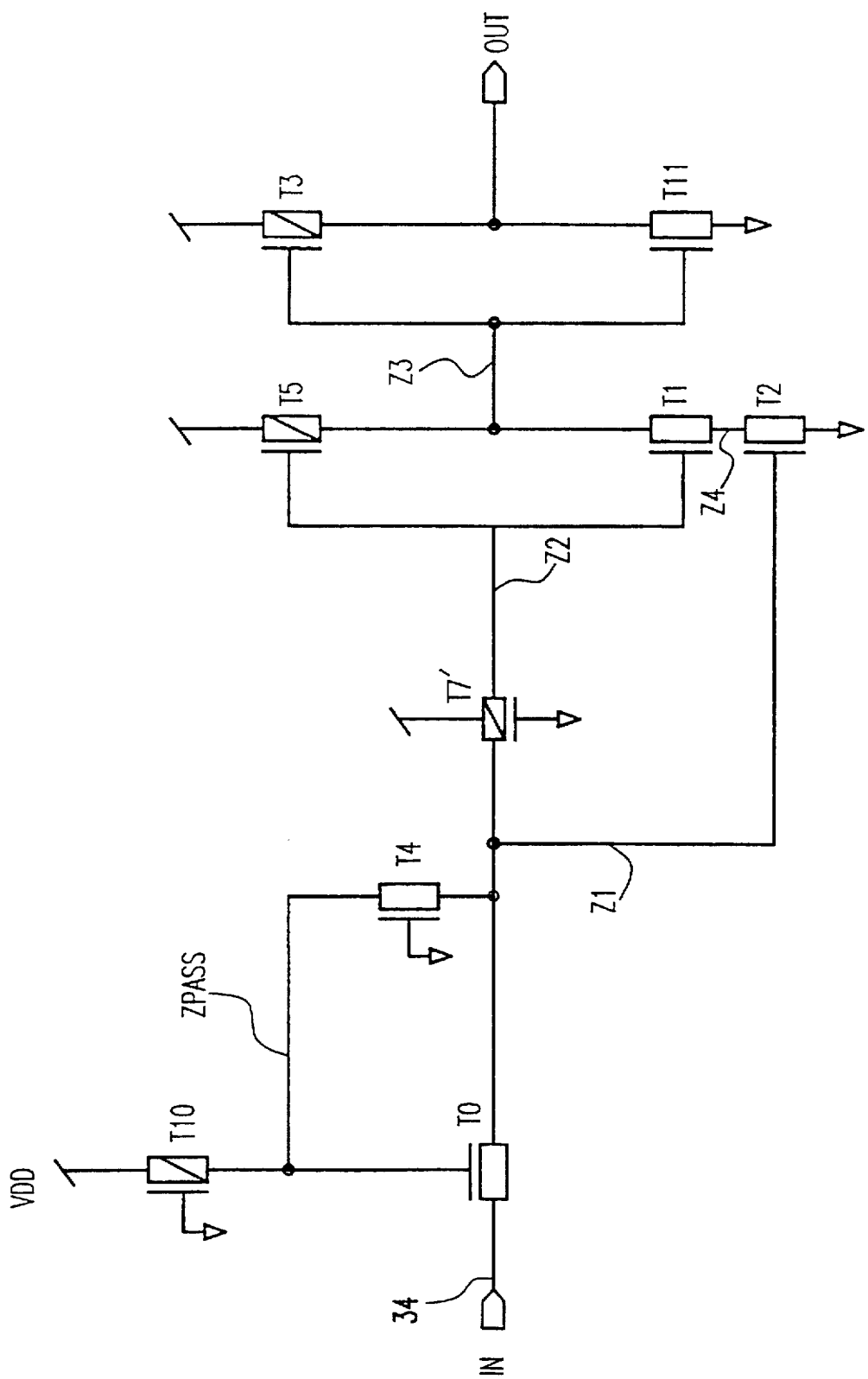

It is generally customary to tie the NWELL of a PFET to the chip's operating voltage (VDD), as shown in FIG. 4E. However, by tying the NWELL of T7 to Z1, the PFET is able to pass a lower low to node Z2. This is demonstrated in FIG. 4C, which compares the two NWELL biasing schemes. When input 34 is high, the Vts of the two biasing schemes are similar and the PFET passes the voltage on node Z1 to node Z2. When input 34 goes low, the Vt of PFET T7' with its NWELL tied to VDD as shown in FIG. 4E is seen to increase due to body effect and Z2 only gets to ≈+0.6v. On the other hand, if PFET T7 has its NWELL tied to node Z1 as shown in FIGS. 4 and 4D its Vt decreases as the input 34 goes low. Consequently, this arrangement permits PFET T7 to discharge node Z2 down to ≈+0.2v. A lower low on node Z2 is desirable because it provides more overdrive to T5, which improves the receiver's performance.

To insure adequate noise immunity and to prevent NFET T2 oxide stress, the NFET stack of T1 and T2 is used as noise limiting/dielectric protection circuitry. By connecting T2's gate to node Z1, more noise can be tolerated around a logic low (GND) at the input. If T1 was removed and T2's drain connected directly to node Z3 and T2's gate connected to node Z2, NFET T2 would barely be off (Vg ≈0.2v) when the input 34 was at GND. By driving T2's gate with Z1, NFET T2 is firmly off when a logic low is present at input 34. NFET T1 is used in series with T2 to prevent over voltage stress on T2. If T1 was removed and T2's drain connected directly to node Z3 and its gate were kept connected to node Z1, T2's gate would be subject to stress during an undershoot. For instance, if node Z1 undershoots to −0.9v, node Z2 is at ≈0.2v and PFET T5 is on. If node Z3 is charged up to VDD through PFET T5, then T2 would see a gate to drain stress of 2.7v (1.8v−(−0.9v)). The addition of NFET T1 drops the voltage at node Z4 to a level which prevents T2 gate stress. To further reduce the capacitance on node Z2 and increase the receiver's performance, the gate of T1 can be connected to VDD (as shown in FIG. 4D) or node Z3 (diode connected) instead of node Z2. The series PFET implementation shown in FIG. 4 is good for technologies which can't tolerate as much undershoot as would be allowed in the implementations shown in FIGS. 3 and 3A since the PFET T7 prevents node Z2 from going as low as node Z1.

FIGS. 4A and 4B show unrealistic worst case voltage and current waveforms for the circuit of FIG. 4. A dc voltage of −1v at input 34 is unrealistic since undershoots are transitory, not steady state. The rise and fall times of 100 ps on the input 34 are also unrealistically fast. With a −1v input, voltage division across T10 and T4 results in a ≈1.3v at node ZPASS and ≈−0.85v at node Z1. Node Z2 is shown to settle at approximately GND. This discharge to GND occurs because T7's NWELL is biased at −0.85v by node Z1, which results in T7's P+/NWELL junction forward biasing and discharging node Z2. When the input 34 switches high to 3.5v, the current path through T4 is shut off and node ZPASS is capacitively coupled up above VDD and then pulled back down to VDD by T10. The high which is passed through T0 is clamped at ≈1.8v which is also passed through T7 to node Z2 to turn off PFET T5. When input 34 switches back to −1v, node ZPASS is capacitively coupled down and T4 turns on at ≈−0.3v. Node Z1 is pulled down to −0.85v and Z2 is initially pulled down to ≈0.2v.

Figure 5:
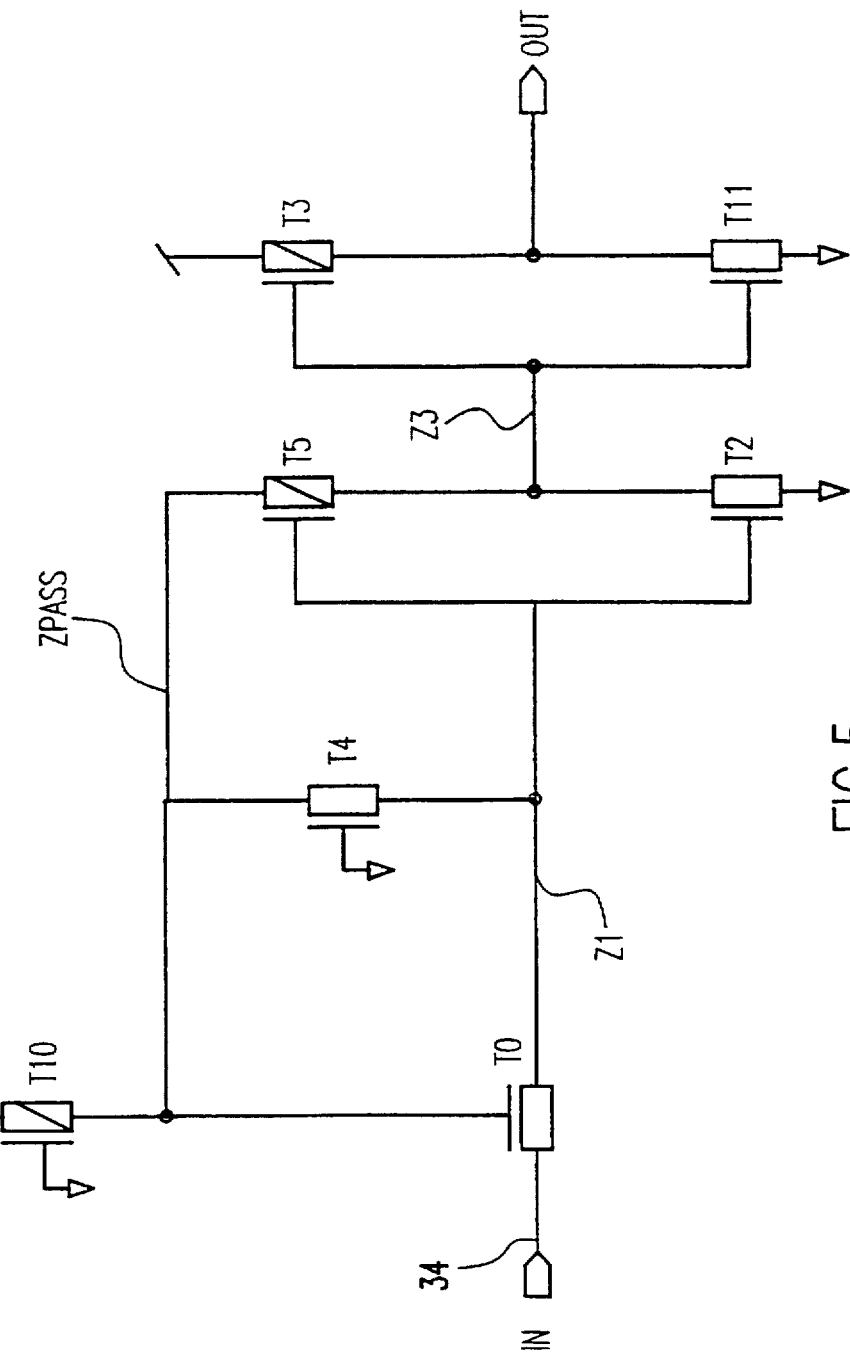
FIG. 5 is a circuit diagram of an alternative embodiment of the invention without using a series PFET.

Turning now to FIG. 5 there is shown another preferred embodiment where node ZPASS is used to power T5's source. Node ZPASS is normally at VDD (1.8v) when the input 34 is above −0.3v. When an undershoot more negative than−0.3v occurs, T4 turns on and lowers the potential on node ZPASS as current is fed into the undershoot. Because the pullup path of the receiver input stage in this implementation consists of two devices (T10 and T5), the widths of these devices have to increase to maintain a VDD/2 switch point. A receiver with a VDD/2 switch point has the most noise margin. For a logic high of 1.8v, the input would have to glitch below 0.9v for the receive's output (Z3, OUT) to glitch. The same is true at a logic low (GND), where the input would have to glitch above 0.9v to glitch the receiver output. The width of T4 also has to increase in order to quickly pull down node ZPASS in the event of an undershoot.

Figure 5A:
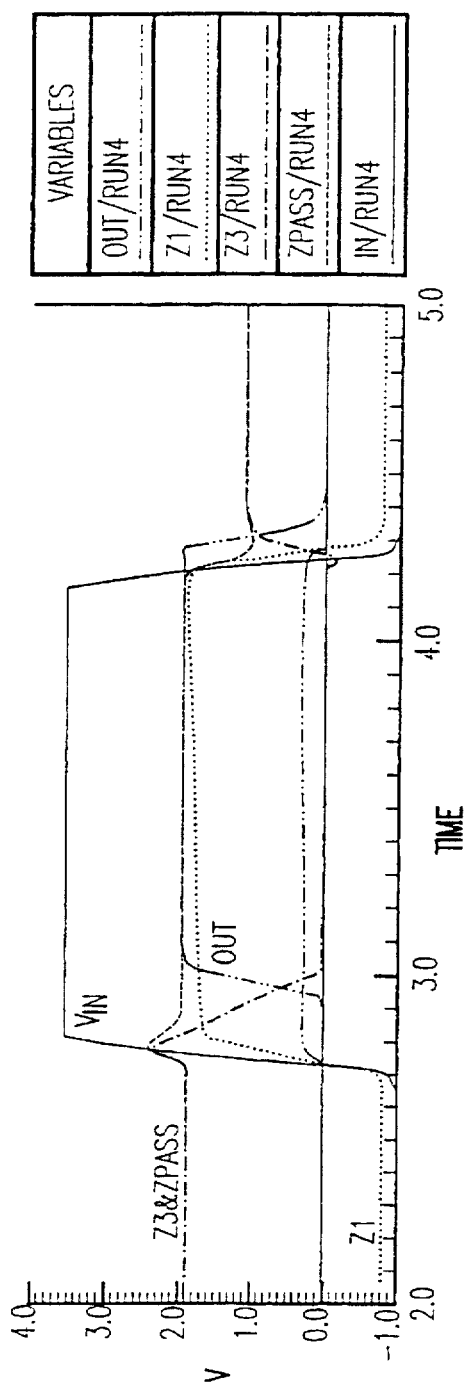
FIGS. 5A and 5B are voltage and current waveforms, respectively, showing worst-case operation of the circuit shown in FIG. 5.
Figure 5B:
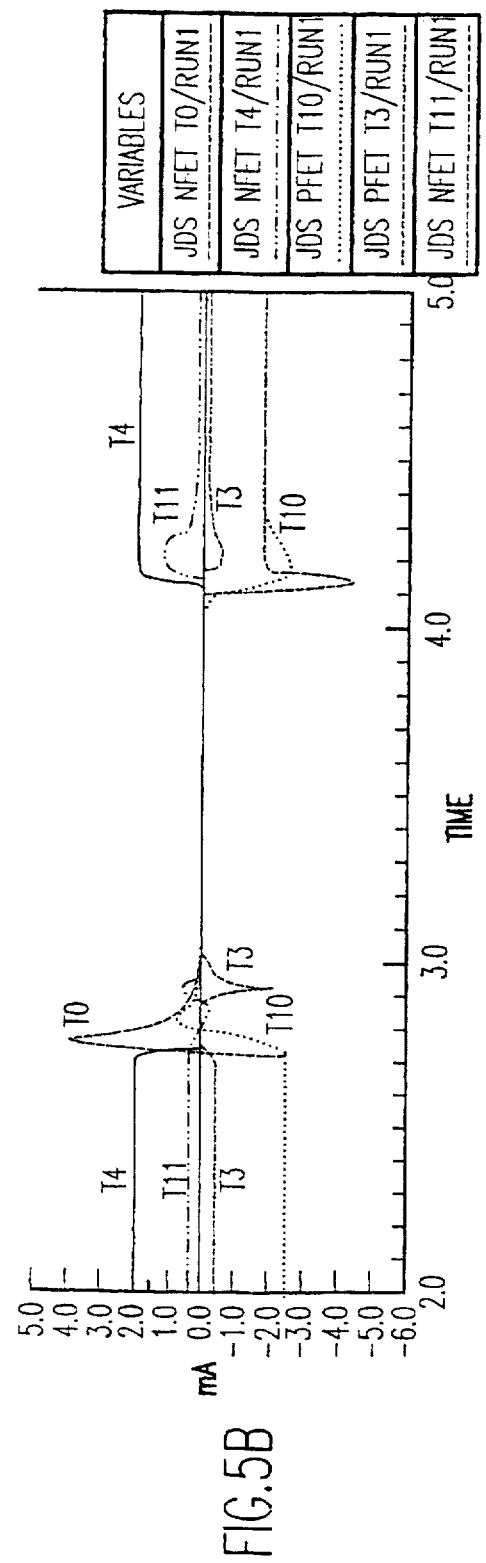

FIGS. 5A and 5B show unrealistic worst case voltage and current waveforms for the circuit shown in FIG. 5. A dc voltage of −1v at the input 34 is unrealistic since undershoots are transitory, not steady state. The rise and fall times of 100 ps on the input 34 are also unrealistically fast. With a −1v input, voltage division across T10 and T4 results in ≈1.3v at node ZPASS and Z3, and ≈−0.7v at node Z1. Note, since PFET T5 is on, charge can be drawn out of node Z3 when T4 turns on. With the voltage on node Z3 lowered, the gate stress on devices T5 and T2 is also lowered to acceptable levels (1.3v−(−0.7)≈2.0v). With node Z3 at ≈1.3v, T3 is partially on which results in ≈0.3 mA of shoot-through current. This current is transient and will stop once the undershoot has risen above −0.3v and T4 shuts off. When the input 34 switches high to 3.5v, the current path through T4 is shut off and node ZPASS is capacitively coupled up above VDD and then pulled back down to VDD by T10. The high voltage which is passed through T0 is clamped at ≈1.8v which turns on NFET T2 and turns off PFET T5. When the input 34 switches back to −1v, node ZPASS is capacitively coupled down and T4 turns on when Z1 reaches ≈−0.3v. Node Z1 is pulled down to −0.7v and node Z3 is pulled down to ≈1.3v.

The invention has been described in terms of several preferred embodiments, and those skilled in the art will recognize that the invention can be practiced with modification within the spirit and scope of the appended claims.

Having thus described our invention, what we claim as new and desire to secure by Letters Patent is as follows:

1. A dynamic over-voltage and under-voltage protection circuit for a receiver, comprising:

a power source providing a supply voltage conforming to said receiver, said power source being connected to said circuit between a power node and a ground node;

a zero-threshold pass transistor having a source, a drain, a gate and an oxide stress voltage limit, wherein said source receives an input signal and said drain is connected to an input of said receiver; and means for controlling said zero-threshold pass transistor gate so as to prevent under and over-voltage stresses from said input signal from damaging said receiver and said protection circuit, said controlling means being connected to said power node.

2. The circuit of claim 1, wherein said controlling means comprises a plurality of transistors.

3. The circuit of claim 2, wherein said plurality of transistors comprises:
   a first transistor having a source, drain and gate; and
   a second transistor having a source, drain and gate, wherein said first transistor source is connected to said power node, said first transistor drain is connected to said second transistor drain and said gate of said pass transistor at a node ZPASS, said second transistor source is connected to said receiver input at a node Z1, and said gates of said first and said second transistors are connected to said ground node.

4. The circuit of claim 3, wherein said zero-threshold pass transistor is of high impedance, said second transistor is of low impedance, and the impedance of said first transistor is selected so as to keep said node ZPASS within said oxide stress voltage limit.

5. The circuit of claim 4, wherein said selected impedance of said first transistor is low enough to hold said node ZPASS below said oxide stress voltage limit when said input signal is fast rising.

6. The circuit of claim 5, wherein said selected impedance of said first transistor is high enough to allow said node ZPASS to fall below said oxide stress voltage limit when said input signal undershoots.

7. The circuit of claim 3, further comprising undervoltage limiting circuitry and noise limiting/dielectric protection circuitry for protecting said receiver input.

8. The circuit of claim 7, wherein said undervoltage limiting circuitry comprises a series transistor having a source, a drain, a gate, and an NWELL, said series transistor source being connected at said node Z1 to said drain of said zero-threshold pass transistor and said series transistor drain being connected at a node Z2 to said receiver input and said series transistor gate being connected to said ground node, and wherein said zero-threshold pass transistor is of low impedance and said second transistor is of higher impedance relative to said impedance of said zero-threshold pass transistor.

9. The circuit of claim 8, wherein said series transistor is a PFET.

10. The circuit of claim 9, wherein said NWELL of said series transistor is connected to said power node.

11. The circuit of claim 9, wherein said NWELL of said series transistor is connected to said node Z1.

12. The circuit of claim 10, for use in a receiver having top and bottom input transistors, wherein noise limiting/dielectric protection circuitry comprises:
   a third transistor, said third transistor being stacked with said bottom input transistor, the gate of said third transistor being connected to said node Z2 and to the gate of said top input transistor, the drain of said third transistor being connected to the drain of said top input transistor, and the source of said third transistor being connected to the drain of said bottom input transistor, wherein the gate of said bottom input transistor is connected to said node Z1, the source of said top input transistor is connected to said power node and the source of said bottom input transistor is connected to said ground node.

13. The circuit of claim 11, for use in a receiver having top and bottom input transistors, wherein said noise limiting/dielectric protection circuitry comprises:
   a third transistor, said third transistor being stacked with said bottom input transistor, the gate of said third transistor being connected to said power node, the gate of said top input transistor being connected to said node Z2, the drain of said third transistor being connected to the drain of said top input transistor, and the source of said third transistor being connected to the drain of said bottom input transistor, wherein the gate of said bottom input transistor is connected to said node Z1, the source of said top input transistor is connected to said supply voltage and the source of said bottom input transistor is connected to said ground node.

14. The circuit of claim 11, for use in a receiver having top and bottom input transistors, wherein said noise limiting/dielectric protection circuitry comprises:
   a third transistor, said third transistor being stacked with said bottom input transistor, the gate of said third transistor being connected to said node Z3, the gate of said top input transistor being connected to said node Z2, the drain of said third transistor being connected to the drain of said top input transistor, and the source of said third transistor being connected to the drain of said bottom input transistor, wherein the gate of said bottom input transistor is connected to said node Z1, the source of said top input transistor is connected to said power node and the source of said bottom input transistor is connected to said ground node.

15. The circuit of claim 3, for use in a receiver having top and bottom input transistors, the gates of said top and bottom input transistors being connected to said node Z1, the drains of said top and bottom input transistors being connected at a node Z3 in said receiver, and the source of said bottom input transistor being connected to a ground in said receiver, wherein the source of said top transistor is connected to node ZPASS.

* * * * *